US009278409B2

(12) United States Patent
Kawasaki et al.

(10) Patent No.: US 9,278,409 B2
(45) Date of Patent: Mar. 8, 2016

(54) CORE BALL, SOLDER PASTE, FORMED-SOLDER, FLUX-COATED CORE BALL AND SOLDER JOINT

(71) Applicant: Senju Metal Industry Co., Ltd., Tokyo (JP)

(72) Inventors: Hiroyoshi Kawasaki, Tochigi-ken (JP); Shigeki Kondo, Tochigi-ken (JP); Atsushi Ikeda, Tochigi-ken (JP); Takahiro Roppongi, Tochigi-ken (JP); Daisuke Soma, Tochigi-ken (JP); Isamu Sato, Saitama-ken (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 14/613,175

(22) Filed: Feb. 3, 2015

(65) Prior Publication Data
US 2015/0217408 A1 Aug. 6, 2015

(30) Foreign Application Priority Data
Feb. 4, 2014 (JP) .................................. 2014-019720

(51) Int. Cl.
*H01B 5/00* (2006.01)
*B32B 15/04* (2006.01)
(Continued)

(52) U.S. Cl.
CPC ........... *B23K 35/025* (2013.01); *B23K 35/0244* (2013.01); *B23K 35/262* (2013.01);
(Continued)

(58) Field of Classification Search
CPC .. B23K 35/262; B23K 35/264; B23K 35/025; B23K 35/0244; B23K 35/302; H01B 1/02; C22C 9/00; C22C 13/00; C22C 13/02
USPC ................................ 174/126.2, 256; 428/457
See application file for complete search history.

(56) References Cited

U.S. PATENT DOCUMENTS 5,851,482 A * 12/1998 Kim ..................... B23K 35/262
420/557
6,474,537 B1 * 11/2002 Hasegawa ................ B23K 1/08
228/103

(Continued)

FOREIGN PATENT DOCUMENTS

JP   09-260427   10/1997
JP   2005-002428   1/2005

(Continued)

OTHER PUBLICATIONS

English translation of Office Action from related pending Korean Application No. 10-2015-0014755, mailing date of office action: May 20, 2015, 5 pgs.
Office Action from related pending Korean Application No. 10-2015-0014755, date of office action: Jul. 20, 2015, 6 pgs.
Decision to Grant a Patent for Japanese Priority Application No. 2014-019720, Dispatch date Apr. 1, 2014, with English translation, 6 pgs.
English translation of Abstract, Japanese Publication No. 2007-046087, published Feb. 22, 2007, Millenium Gate Technology Co. Ltd., 1 pg.
English translation of Abstract, Japanese Publication No. 2013-185214, published Sep. 19, 2013, JX Nippon Mining & Metals Corp.

*Primary Examiner* — Sherman Ng
(74) *Attorney, Agent, or Firm* — Chernoff, Vilhauer, McClung & Stenzel, LLP (57) ABSTRACT

A core ball wherein a junction melting temperature and a low alpha dose are set for suppressing a soft error generation and solving a mounting problem. A metallic powder as a core is a sphere. A pure degree of a Cu ball of the metallic powder is equal to or higher than 99.9% but equal to or less than 99.995%. A contained amount of one of Pb and Bi or a total contained amount of Pb and Bi is equal to or higher than 1 ppm. A sphericity of the Cu ball is at least 0.95. A solder plating film for coating the Cu ball comprises Sn—Bi based alloy. U contained in the solder plating film is equal to or less than 5 ppb and Th is equal to or less than 5 ppb. An alpha dose of the core ball is equal to or less than 0.0200 cph/cm$^2$.

21 Claims, 4 Drawing Sheets

(51) Int. Cl.
  *B23K 35/02*  (2006.01)
  *B23K 35/26*  (2006.01)
  *B23K 35/30*  (2006.01)
  *C22C 9/00*   (2006.01)
  *C22C 13/00*  (2006.01)
  *C22C 13/02*  (2006.01)
  *H01B 1/02*   (2006.01)
  *H01L 23/00*  (2006.01)

(52) U.S. Cl.
  CPC .............. *B23K35/302* (2013.01); *C22C 9/00* (2013.01); *C22C 13/00* (2013.01); *C22C 13/02* (2013.01); *H01B 1/02* (2013.01); *H01L 24/13* (2013.01); *H01L 2224/13014* (2013.01); *H01L 2224/13147* (2013.01); *H01L 2224/13655* (2013.01); *H01L 2224/13657* (2013.01); *H01L 2924/0103* (2013.01); *H01L 2924/014* (2013.01); *H01L 2924/0105* (2013.01); *H01L 2924/0109* (2013.01); *H01L 2924/01015* (2013.01); *H01L 2924/01026* (2013.01); *H01L 2924/01027* (2013.01); *H01L 2924/01029* (2013.01); *H01L 2924/01032* (2013.01); *H01L 2924/01047* (2013.01); *H01L 2924/01049* (2013.01); *H01L 2924/01051* (2013.01); *H01L 2924/01082* (2013.01); *H01L 2924/01083* (2013.01); *H01L 2924/01092* (2013.01); *H01L 2924/15311* (2013.01); *H01L 2924/15321* (2013.01); *H01L 2924/15331* (2013.01)

(56) References Cited

U.S. PATENT DOCUMENTS

| | | | |
|---|---|---|---|
| 2002/0074656 A1* | 6/2002 | Ujiie | H01L 23/3107 257/738 |
| 2009/0232696 A1* | 9/2009 | Ohnishi | B23K 35/262 420/561 |
| 2010/0035072 A1* | 2/2010 | Watanabe | B22F 1/0059 428/457 |
| 2013/0028786 A1* | 1/2013 | Kanou | B23K 35/262 420/558 |

FOREIGN PATENT DOCUMENTS

| | | |
|---|---|---|
| JP | 2005-036301 | 2/2005 |
| JP | 2007-46087 A | 2/2007 |
| JP | 4472752 B | 3/2010 |
| JP | 2013-185214 A | 9/2013 |
| JP | 5408401 B1 | 2/2014 |
| JP | 5435182 B1 | 3/2014 |
| WO | 9524113 A1 | 9/1995 |
| WO | 2007004394 A1 | 1/2001 |
| WO | 2012/120982 A1 | 2/2012 |
| WO | 2013014166 A1 | 1/2013 |

* cited by examiner

TABLE 1

| | Cu | Sn | Sb | Bi | Zn | As | Ag | Cd | Ni | Pb | Au | P | S | U | Th | ALPHA DOSE (cph/cm²) | SPHERICITY |
|---|---|---|---|---|---|---|---|---|---|---|---|---|---|---|---|---|---|
| Cu BALL USING Cu PELLET HAVING PURE DEGREE OF 99.9% | bal. | 84 | 21 | 32 | 3 | 49 | 20 | 7 | 4 | 16 | 4 | 200 | 18 | 1.5 | <0.5 | <0.0010 | 0.9932 |
| Cu BALL USING Cu WIRE HAVING PURE DEGREE ≤ 99.995% | bal. | 8 | 10 | 19 | - | 24 | 13 | - | 1 | 8 | - | - | - | <0.5 | <0.5 | <0.0010 | 0.9931 |
| Cu BALL USING Cu PLATE HAVING PURE DEGREE > 99.995% | bal. | 13 | 2 | 18 | - | 10 | - | - | 1 | 3 | - | - | - | 0.9 | <0.5 | <0.0010 | 0.9227 |

*ppb FOR MASS OF U, Th; ppm FOR MASS OF OTHER ELEMENTS

FIG. 4

TABLE 2

| | Sn | Bi | Cu | Sb | Zn | Fe | Al | As | Ag | In | Cd | Ni | Pb | Au | U | Th | Cu CORE BALL α DOSE (cph/cm²) | Cu CORE BALL SPHERICITY |
|---|---|---|---|---|---|---|---|---|---|---|---|---|---|---|---|---|---|---|
| EMBODIMENT 1 | bal. | 57.9% | 0 | 1 | 0 | 0 | 0 | 0 | 2 | 1 | 0 | 3 | 5 | 0 | <0.2 | <0.2 | <0.0010 | 0.9941 |
| EMBODIMENT 2 | bal. | 58.2% | 0 | 3 | 0 | 1 | 0 | 0 | 10 | 1 | 0 | 8 | 4 | 0 | <0.2 | <0.2 | <0.0010 | 0.9932 |
| COMPARISON EXAMPLE 1 | bal. | 58.1% | 5 | 6 | 0 | 3 | 0 | 13 | 24 | 3 | 0 | 19 | 26 | 0 | <0.2 | <0.2 | 0.2242 | 0.9795 |
| Bi SHEET MATERIAL | 5 | bal. | 13 | 0 | 0 | 1 | 0 | 0 | 60 | 0 | 0 | 0 | 1 | 0 | <0.2 | <0.2 | α DOSE OF Bi SHEET MATERIAL 0.2389 | - |
| Sn SHEET MATERIAL | bal. | 11 | 0 | 11 | 0 | 5 | 0 | 21 | 6 | 11 | 0 | 30 | 49 | 1 | <0.2 | <0.2 | α DOSE OF Sn SHEET MATERIAL 0.2031 | - |

*ppb FOR MASS OF U, Th; ppm FOR MASS OF OTHER ELEMENTS

FIG. 5

CORE BALL, SOLDER PASTE, FORMED-SOLDER, FLUX-COATED CORE BALL AND SOLDER JOINT

CROSS REFERENCE TO RELATED APPLICATION

The present invention contains the subject matter related to Japanese Patent Application No. 2014-019720 filed in the Japanese Patent Office on Feb. 4, 2014, the entire contents of which being incorporated herein by reference.

BACKGROUND OF THE INVENTION

1. Field of the Invention

The present invention relates to a core ball, a solder paste, a formed-solder, a flux-coated core ball and a solder joint that are designed to reduce a junction temperature with less alpha dose.

2. Description of Related Art

Recently, along development of compact information equipment, electronic components to be mounted on them have been downsized rapidly. A ball grid alley (hereinafter referred to as "BGA") having electrodes at its rear surface is applied to such electronic components in order to satisfy a requirement of a narrowed connection terminal and a reduced mounting area because of the downsizing requirement.

In the electronic components wherein the BGA is applied to its semiconductor package, a semiconductor chip having electrodes is sealed with resin and solder bumps are formed on the electrodes of the semiconductor chip. The solder bump is that a solder ball is joined to the electrode of the semiconductor chip. This solder bump is connected to a conductive land of a printed circuit board so as to be mounted on the printed circuit board.

Recently, a three-dimensional high-density package is studied by stacking up the semiconductor packages in a height direction in order to meet the additional high-density mounting.

In a case that the BGA is applied to the semiconductor package for the three-dimensional high-density mounting, the solder ball may be crushed by a semiconductor package's weight. If such an accident happens, the solder may be forced out so that a circulatory shunt may happen between the electrodes.

In order to resolve the above-described problems, it is considered to use a ball whose hardness is higher than that of the solder ball. As the ball having a higher hardness, a solder bump using a Cu ball or Cu core ball is reviewed. The Cu core ball is that a solder coating (solder plating film) is formed on a surface of the Cu ball.

Since the Cu ball and the Cu core ball do not melt at a melting temperature of the solder, the solder bump does not crush at a mounting process even if the solder bump receives the weight of the semiconductor package. Therefore, the semiconductor package can be supported very well. Such technology associated to the Cu ball and the like is disclosed, for example, in International Patent Publication No. WO/1995/24113 (hereinafter referred to as "WO/1995/24113 publication").

By the way, the downsizing of the electronic components allows the high-density mounting, but the high-density mounting causes soft error problems. The soft error is a possibility of rewriting a storage content of a memory cell in a semiconductor integrated circuit (IC circuit) with alpha ray entering into the memory cell.

It is conceivable that beta decay occurs on a radioactive element such as U, Th, Po, etc. in the solder alloy or a radioactive isotope included in Pb, Bi, etc. and then alpha decay occurs so that the alpha ray is emitted. Recently, a low alpha ray solder material is developed wherein the contained amount of the radioactive element is reduced. An associated technology is disclosed, for example, in Japanese Patent No. 4,472,752 (hereinafter referred to as "JP/4,472,752 patent").

International Patent Publication No. WO/2013/14166 (hereinafter referred to as "WO/2013/14166 publication") discloses a technology of a low temperature reflow performed with a low temperature melting point by using a core ball wherein a surface of a solder ball is coated with a plating layer comprising a Sn—Bi alloy. Japanese Patent Application Publication No. 2013-185214 (hereinafter referred to as "JP/2013-185214 publication") discloses a technology that reduces the alpha dose of Bi as a solder material to a value equal to or less than 0.0100 cph/cm$^2$. Japanese Patent Application Publication No. 2007-46087 (hereinafter referred to as "JP/2007-46087 publication") discloses a technology that strengthens a joint strength and reduces the melting temperature.

By the way, the WO/1995/24113 publication discloses the Cu ball and the Cu core ball having the higher sphericity. However, this publication counts out the lowering alpha dose of the Cu core ball.

The WO/1995/24113 publication describes, in its background explanation column, only Pb—Sn alloy as the solder alloy of making up the solder film. The alpha ray is emitted from an isotope $^{210}$Pb of Pb included as an impurity in Sn material along the decay process $^{210}$Pb->$^{210}$Bi->$^{210}$Po->$^{206}$Pb.

It is conceivable that the Pb—Sn solder alloy contains its radioactive isotope $^{210}$Pb because the Pb—Sn solder alloy contains Pb in large quantities wherein this solder alloy is only one material disclosed in the WO/1995/24113 publication. Therefore, even if this solder alloy is used as the solder film of the Cu core ball, it is impossible to reduce the alpha dose.

The WO/1995/24113 publication does not disclose a Sn plating on the Cu ball and an electrolytic plating under a flowage condition of the Cu ball and electrolytic solution.

In electrolytic refining described in the WO/1995/24113 publication, since an electrolytic deposition surface is limited to one direction, it is impossible to form a plating film having an even film thickness on a micro work piece such as the Cu ball.

The JP/4,472,752 patent discloses a technology of Sn ingot having a low alpha dose wherein it does not only electrolytically refine but also reduces the alpha dose by suspending adsorbent in the electrolytic solution to adsorb Pb and Bi.

According to the JP/4,472,752 patent, since a standard electrode potential of Pb or Bi is close to that of Sn, it is difficult to reduce the alpha dose only by depositing electrolytically Sn on a plate electrode with a general electrolytic refining. Assuming that the electrolytic refining is applied to a process of forming the plating film on the Cu ball and the adsorbent is suspended in the plating solution for the barrel plating similarly to the description of this patent, the adsorbent is stirred when stirring the plating solution and the work piece. According to this stirring, there is a possibility that the Pb ion and Bi ion absorbed on the adsorbent become carriers and are incorporated into the solder film along with the adsorbent.

The solder film, which takes the adsorbent, emits the high alpha ray. Since the adsorbent has a very small grain diameter of the order of sub-micron, it is difficultly conceivable to separate and collect the adsorbent after the suspension while flowing the plating solution. Therefore, it is difficult to prevent the adsorbent, which has absorbed Pb and Bi, from being incorporated into the film.

In addition, the WO/1995/24113 publication discloses a Pb—Sn based solder alloy. However, since this publication describes a plating method, a deposit method, a brazing method and the like as an equivalent method, it does not disclose a reduction of the alpha dose for a Sn based solder.

The subject matter of the WO/1995/24113 publication is to manufacture the Cu core ball having the high sphericity. On the other hand, the JP/4,472,752 patent discloses the reduction of the alpha dose by removing Pb from Sn material wherever possible in the electrolytic refining process.

Therefore, a person skilled in the art, who knows the WO/1995/24113 publication, cannot suppose a problem where it is required to reduce the alpha dose from the Cu core ball disclosed in this publication. In addition, the composition of the Pb—Sn solder is different from that of the Sn based solder. Thus, it is conceivable that huge numbers of trial-and-error processes are required to suppose the problem of reducing the alpha dose and to select the Sn based solder, especially the Sn—Bi based alloy solder from an endless number of solder alloys instead of the Pb—Sn solder alloy for the solder film.

It may be very difficult for those skilled in the art to make the plating solution by using the Sn ingot having the lower alpha dose described in the WO/1995/24113 publication and to form the Cu core ball with the plating method described in this publication.

If a joint is formed by using the Cu core ball manufactured with the prior arts described in the WO/1995/24113 publication or the JP/4,472,752 patent, there is a high possibility that radioactive elements in the solder film of the Cu core ball diffuse into the electrodes of the joint and then the alpha ray is emitted. Therefore, it is impossible to solve the soft error as a new problem of the high-density mounting.

The WO/2013/14166 publication discloses a technology that uses a Sn—Bi alloy as a plating layer (solder layer) and sets a contained amount of Bi in the alloy to 45-65% for allowing a reflow process under a low temperature equal to or lower than 160° C. However, this publication does not discuss what kinds of balls are used as the core ball and how to reduce the alpha dose of the Cu ball and the solder layer in order to countermeasure the soft error.

The JP/2013-185214 publication discusses a technology that prevents the soft error by suppressing the alpha dose of Bi used as the solder material. The subject matter of this publication is to improve only the solder material. However, it does not disclose at all a technology that attempts to reduce the alpha dose of the ball as the core in the core ball for reducing the alpha dose of the solder plating film.

The JP/2013-185214 publication describes the Sn—Bi alloy having the low alpha dose. However, this publication describes that an additive agent is not used for the alloy. It does not review at all the electrolytic plating that requires a usage of the additive agent, such as a chelating agent, a brightening agent and the like. As described above, although the Sn—Bi alloy is used by melting the pure metals of Sn and Bi in this publication, it does not completely the technology for forming the core ball with the electrolytic plating method (wet type plating method). In addition, since Bi decays to its radioactive isotope, it is difficult to reduce the alpha dose. As a result, the alpha dose of the manufactured Bi is equal to or less than 0.0100 cph/cm² in this publication.

The JP/2007-46087 publication discloses a technology that forms a plating layer of the Sn—Bi alloy on the surface of the core ball made of Cu for increasing the joint strength and lowering the melting temperature.

However, for this purpose, a composition ratio of Bi contained in the plating layer must be changed from its inner portion (core surface) to its outer portion (outer surface) and thereby a technically difficult process is required. Moreover, this publication does not disclose a technique of lowering the alpha dose of the core ball as well as the solder plating film.

SUMMARY OF THE INVENTION

Therefore, the present invention provides a core ball, a solder paste, a flux coated core ball and a solder joint that suppress the generation of the soft error, lower the solder melting point during the mounting process and reduce a thermal stress to the mounted parts.

In order to solve the above-described problems, the core ball of the present invention comprises a sphere-shaped metallic powder and a solder plating film for coating a surface of the metallic powder.

According to a first aspect of the present invention, the sphere-shaped metallic powder has a metallic degree of purity that is equal to or higher than 99.9% but equal to or less than 99.995%, the total contained amount of Pb and/or Bi is equal to or larger than 1 ppm and its sphericity is equal to or higher than 0.95. In addition, the solder plating film for coating the metallic powder is a Sn—Bi based Pb-free solder alloy including Bi in an amount of 40-60 mass percent wherein the contained amount of U and Th is equal to or less than 5 ppb respectively and its alpha dose is equal to or less than 0.0200 cph/cm².

According to a second aspect of the present invention, the metallic powder is a sphere wherein the metallic pure degree is equal to or higher than 99.9% but equal to or less than 99.995%, and the contained amount of U is equal to or less than 5 ppb. In addition, the contained amount of Th is equal to or less than 5 ppb and that of Pb and/or Bi is equal to or larger than 1 ppm. Moreover, its alpha dose is equal to or less than 0.0200 cph/cm² and its sphericity is equal to or higher than 0.95. The solder plating film for coating the metallic powder is the Sn—Bi based Pb-free solder alloy including Bi having 40-60 mass percent.

According to a third aspect of the present invention, the solder plating film uses the Sn—Bi based Pb-free solder alloy of the second aspect wherein the contained amounts of U and Th are equal to or less than 5 ppb respectively and the alpha dose is equal to or less than 0.0200 cph/cm².

According to a fourth aspect of the present invention, the solder plating film of the aspect 1 or 3 is characterized in that the alpha dose is equal to or less than 0.0020 cph/cm².

According to a fifth aspect of the present invention, the solder plating film of the aspect 1 or 3 is characterized in that the alpha dose is equal to or less than 0.0010 cph/cm².

According to a sixth aspect of the present invention, in the aspects 1 through 5, a Cu ball is used for the metallic powder.

According to a seventh aspect of the present invention, in the aspects 1 through 6, the metallic powder is previously coated with a plating layer comprising at least one element selected from a group comprising Ni and Co before being coated with the solder plating film.

According to an eighth aspect of the present invention, in the aspects 1 through 7, the solder plating film comprises the Sn—Bi based alloy containing at least one selected from a group comprising Ag, Cu, Ni, In, Zn, Sb, Ge, Co, P and Fe.

According to a ninth aspect of the present invention, in the aspects 1 through 8, the flux coated core ball is formed by coating a flux layer on the core ball.

According to a tenth aspect of the present invention, in the aspects 1 through 9, the solder paste comprises the core ball.

According to an eleventh aspect of the present invention, in the aspects 1 through 9, the formed solder comprises the core ball.

According to a twelfth aspect of the present invention, in the aspects 1 through 9, the solder joint comprises the core ball.

When the inventors determined conditions of lowering the alpha dose of the metallic powder and lowering the junction temperature, they selected the metallic powder used for the core ball. The metallic powder has a sphere shape and its material is a metallic powder material such as Cu, Ni, Ag, Co and the like.

In a case of using the Cu ball as the metallic powder, it is preferable that this Cu ball contains an impurity. If the Cu ball does not contain a predetermined amount of Pb and/or Bi as a specified metal, the sphericity of the Cu ball is lowered and an even solder plating on the Cu ball cannot be accomplished in the solder plating process. As a result, it is known that the sphericity of the obtained Cu ball is lowered.

The lowered alpha dose of the Cu ball can be accomplished by forming a sphere of the Cu ball under a heating treatment at a high temperature equal to or higher than 1,000° C. so as to volatilize a radioactive element of the impurities contained in the Cu ball.

In order to reduce the alpha dose of the solder film for composing the Cu ball, the inventors positively reviewed the forming of the solder plating film by using the plating method.

The inventors formed the plating film on the Cu ball by flowing the Cu ball and the plating solution in order to reduce Pb and Bi in the plating solution and reduce Po that was produced by the decay process of the radioactive isotopes of the elements Pb and Bi. In this treatment, the radioactive isotopes such as Pb, Bi, Po and the like generated salt unexpectedly without suspending the adsorbent. Since the salt was electrically neutral, the plating film did not take these radioactive isotopes and thereby reducing the alpha dose of the plating film composing the core ball.

The Sn—Bi based alloy (Sn—Bi based Pb-free alloy; the same shall apply hereinafter) is preferable to the solder plating film. Bi is the refined Bi having the low alpha dose. Bi is used to decrease the solder melting point to a temperature equal to or less than 200° C. at a time of jointing the Sn—Bi alloy so that a heat stress to the mounting components can be reduced significantly at the solder joint.

DESCRIPTION OF THE PREFERRED EMBODIMENTS

The present invention will be described in detail. The core ball of the present invention comprises a sphere-shaped metallic powder and a solder plating film coated on a surface of the metallic powder. The metallic powder is highly pure and its sphericity is equal to or larger than 0.95. Its alpha dose is lowered. The Sn—Bi based alloy is used for the solder plating film. By using the Sn—Bi based alloy, the junction temperature can be lowered (equal to or less than 20° C.) and the heat stress to the mounting parts can be significantly reduced at a time of the solder reflow.

In this specification, units (ppm, ppb and %) of a composition of the solder film of a core ball represent rates (mass ppm, mass ppb and mass %) to a mass of the solder film if not being specified. Units (ppm, ppb and %) of a composition of the metallic powder such as the Cu ball represent rates (mass ppm, mass ppb and mass %) to a mass of the Cu ball if not being specified.

The metallic powder forming the core is a sphere having a high sphericity. A metal for the metallic powder may be Cu as well as Ni, Ag, Co and the like. The following description relates to the core ball using the Cu ball as the metallic powder.

1. As for Cu Ball:

The Cu ball is not melted at a soldering temperature when being used as a solder bump. Thus, it is preferable that the sphericity of the Cu ball is high and a dispersion of a diameter thereof is small in order to suppress a dispersion of a solder joint height.

(1a) Pure Degree of Cu Ball: from 99.9% (Including 99.9%) to 99.995% (Including 99.995%)

It is preferable that a pure degree of the Cu ball is within a range between 99.9% (including 99.9%) and 99.995% (including 99.995%). By applying an impurity properly, the sphericity of the Cu ball is improved and an enough volume of crystal cores can be kept in Cu solution.

When manufacturing the Cu ball, the Cu material is formed into a predetermined shaped chip and is melted by being heated to a temperature of 1,000° C. or above. Then, the melted Cu becomes a sphere shape with its surface tension. By solidifying it, it becomes the Cu ball. In a process of solidifying the molten Cu material from its liquid state, the crystal grains grow up in the molten sphere-shaped Cu material. It will be discussed in detail hereinafter. In this process, if there are a lot of impurity elements, they become the crystal cores and suppress the growth of the crystal grains. The molten sphere-shaped Cu material becomes the Cu ball having the high sphericity with the fine crystal grains that are suppressed to grow up.

On the other hand, if the number of impurity elements is less, then relatively less elements become the crystal core and they grow up in a directional property without suppressing the grain growth. As a result, a part of the surface of the molten sphere-shaped Cu material projects and solidifies so that the sphericity is low. Therefore, it is necessary to contain the impurity in some degree for increasing the sphericity of the Cu ball.

It is conceivable that the impurity may be Sn, Sb, Bi, Zn, As, Ag, Cd, Ni, Pb, Au, P, S, U, Th, etc. as will become apparent below.

It is desirable that the pure degree of the Cu ball is within a range between 99.9% (including 99.9%) and 99.995% (including 99.995%) from the viewpoints of the sphericity problem, the alpha dose suppression and the degradation suppression of the electrical conductivity and thermal conductivity of the Cu ball. The alpha dose suppression will be described hereinafter. The degradation of the Cu ball's electrical and thermal conductivities is based on the reduced pure degree.

In the solder plating film that will be described hereinafter, the higher its pure degree is, the lower its alpha dose is. On the other hand, in the Cu ball, its alpha dose can be reduced without increasing its pure degree beyond necessity. A reason thereof will be discussed below.

Since the melting point of Cu is higher than that of Sn, the heating temperature of Cu is higher than that of Sn during the sphere forming period. Since a heating treatment at a high temperature is applied to the manufacturing process of the Cu ball, the radioactive elements such as $^{210}$Pb, $^{210}$Bi, etc. contained in the impurity vaporize. The heating treatment was not performed in the prior art and will become apparent below. As a result, even if there is the radioactive element in the impurity, the amount of the alpha dose emitting therefrom is not enough to affect.

As will become apparent below, there are many cases that the plating film of coating the Cu ball contains radioactive isotopes such as $^{210}$Pb, $^{210}$Bi, etc.

The Sn—Bi based alloy is used for the solder plating film. At least one of elements Ag, Cu, Ni, In, Zn, Sb, Ge, Co, P and Fe may be added to the Sn—Bi based alloy. Almost all of the radioactive elements and the radioactive isotopes contained in the solder solution remain in the plating solution without vaporizing. Therefore, it is required to reduce the concentration of the impurities such as Pb, Bi, etc. and to increase the pure degree of the solder plating film as will become apparent below.

(1b) Alpha Dose: Equal to or Less than 0.0200 cph/cm$^2$

The alpha dose emitted from the Cu ball is preferably equal to or less than 0.0200 cph/cm$^2$. This number means that the soft error counts for nothing in the high-density mounting of the electronic components.

In the manufacturing of the Cu ball, an insignificant amount of $^{210}$Po remained in the Cu raw material vaporizes by a reheating treatment process in addition to the normal heating treatment process. Thus, the alpha dose of the Cu ball further lowers in comparison with the Cu raw material. The alpha dose is preferably equal to or less than 0.0020 cph/cm$^2$; more preferably equal to or less than 0.0010 cph/cm$^2$ from a standpoint of suppressing the soft error.

(1c) Total Contained Amount of Pb and/or Bi Equal to or Larger than 1 ppm

The total contained amount of Pb and/or Bi of the impurity elements in the Cu ball is preferably equal to or less than 1 ppm.

$^{210}$Pb and $^{210}$Bi contained in the radioactive elements such as Pb, Bi, etc. change to $^{210}$PO through the beta decay. It is preferable that the contained amount of Pb and Bi as the impurity elements is as small as possible in order to reduce the alpha dose. However, since the contained amount of these radioactive elements is small originally, it is conceivable that $^{210}$Bp and $^{210}$Bi are removed by the heating treatment in the sphere forming process of the Cu ball.

It is better to increase the contained amount of the impurity elements in order to improve the sphericity of the Cu ball. Therefore, it is preferable that the total contained amount of Pb and/or Bi is equal or larger than 1 ppm in consideration of the hardness and sphericity of the Cu ball. This contained amount may be equal or larger than 1 ppm and the amount may be 10-50 ppm or above, for example, about 1,000 ppm in order to suppress the degradation of the electrical conductivity of the Cu ball.

(1d) Sphericity of Cu Ball: Equal to or Higher than 0.95

If the sphericity of the Cu ball is less than 0.95, the Cu ball becomes an indefinite shape. Therefore, there is an increased possibility that the bumps having uneven heights are formed at the bump formation period and poor joints are produced. In addition, the solder plating on the Cu ball may be uneven. When an electrode is mounted on the Cu core ball and it is processed by a reflow treatment, a position gap for the Cu core ball may occur and a self-alignment property may be worse. Therefore, its sphericity is preferably to be equal to or higher than 0.95, more preferably about 0.990.

The sphericity represents a gap from a true sphere. The sphericity can be determined by many kinds of methods, for example, a least-square circle method (LSC method), a minimum zone circle method (MZC method), a maximum inscribed circle method (MIC method), a minimum circumscribed circle method (MCC method), etc.

It is preferable that the above-described values of the sphericity is maintained regardless of the plating film coated on the Cu ball.

(1e) Diameter of Cu Ball: 1-1000 μm

A diameter of the Cu ball composing the present invention is preferably 1-1000 μm. If the diameter is within this range, the spherical Cu ball can be stably manufactured. Moreover, a shorted connection can be prevented when a pitch between the terminals is narrow.

If the diameter of the Cu ball is about 1-300 μm, such ball can be mixed as the powder in the solder paste or the formed solder in a different usage pattern.

In a base process of the Cu ball, the surface of the Cu ball may be previously coated with another metal plating layer before forming the solder plating film. If the surface of the Cu ball is coated with a Ni plating layer, a Co plating layer or the like, a Cu elution into the solder plating film can be reduced. Therefore, it is possible to suppress a Cu thinning in the Cu ball.

2. As for Solder Plating Film

The core ball (the Cu core ball as an example) of the present invention is configured by coating the solder plating film with a predetermined thickness on the surface of the Cu ball.

The solder plating film is formed by flowing the Cu ball as the main work piece and the plating solution. It was found that the elements having the radioactive isotopes in Pb, Bi, Po, etc. generated salt in the plating solution and were deposited. Once the deposit of the salt is generated, it exists stably in the plating solution.

Therefore, according to the Cu core ball, the deposit is not incorporated into the solder plating film so that it can reduce the amount of the radioactive isotopes contained in the solder plating film. As a result, the alpha dose of the Cu core ball can be significantly reduced.

(2a) Composition of Solder Plating Film

The composition of the solder plating film is the Sn—Bi based alloy. In particular, it is the Sn—Bi alloy or an alloy wherein at least one of elements Ag, Cu, Ni, In, Zn, Sb, Ge, Co, P and Fe is added to the Sn—Bi based alloy. They may be Sn—Bi—In alloy, Sn—Bi—Ag—In alloy, Sn—Bi—Ag—Cu alloy, Sn—Bi—Ni alloy, Sn—Bi—Cu—Ni alloy, etc. The contained amount of Bi in each alloy is from 40 mass percent (including 40) to 60 mass percent (including 60).

A thickness of the solder plating film is not specially limited, however, it is preferably equal to or less than 100 μm. Generally, the thickness is 20-50 μm.

(2b) Contained Amount of U: Equal to or Less than 5 ppb, and Th: Equal to or Less than 5 ppb U and Th are radioactive elements. It is required to reduce the contained amount of these elements in order to suppress the soft error. The contained amount of each U and Th should be equal to or less than 5 ppb in order to make the alpha dose of the solder plating film equal to or less than 0.0200 cph/cm$^2$. In addition, from a viewpoint of the suppression of the soft error for the current or future high-density mounting, the contained amount of each U and Th should be equal to or less than 2 ppb. In a case of the measurement method (ICP-MS) used at this time, the value 2 ppb as the contained amount of U and Th is a measurement limit (refer to Table 2 shown in FIG. 5).

(2c) Alpha Dose: Equal to or Less than 0.0200 cph/cm$^2$

The alpha dose emitting from the surface of the Cu core ball is equal to or less than 0.0200 cph/cm$^2$. This amount of the alpha dose does not affect the soft error in the high-density mounting of the electronic components (refer to Table 2 shown in FIG. 5, that will be described hereinafter).

Since the solder plating film is formed under a temperature of about 100° C., it is difficult to consider that the contained amount of U, Th, Po, Bi, Pb, etc. reduce by the vaporization of their radioactive isotopes.

When the plating process is performed during the flowage of the plating solution and the Cu ball, the radioactive elements such as U, Th, Po, etc. and the radioactive isotope such as $^{210}$Pb, $^{210}$Bi, etc. generate the salt in the plating solution and are deposited. The deposited salt is electrically neutral and are not mixed with the solder plating film even if the plating solution flows. Since the salt keeps the deposition state, the contained amount of the radioactive elements in the solder plating film is significantly reduced.

By the plating treatment as described hereinbefore, the contained amount of the radioactive elements in the solder plating film can be significantly reduced. As a result, the alpha dose of the Cu core ball can be suppressed to a value equal to or less than 0.0200 cph/cm$^2$, preferably equal to or less than 0.0020 cph/cm$^2$, more preferably equal to or less than 0.0010 cph/cm$^2$.

The impurities contained in the Sn solder plating film may be Sb, Fe, As, In, Ag, Ni, Pb, Au, U, Th, etc.

3. Manufacturing Example of Cu Core Ball

The manufacturing example of the above Cu core ball will be described hereinafter.

(3a) As for Cu Ball (i) The Cu material as the raw material is put on a heat-resistant plate such as a ceramic plate and both the material and the heat-resistant plate are heated in an oven. The heat-resistant plate has a lot of circle-shaped grooves whose bottoms are hemispherical.

The diameter and depth of the groove are appropriately selected in accordance with the grain diameter of the Cu ball. For example, the diameter is 0.8 mm and the depth is 0.88 mm. The chip-shaped Cu material (hereinafter, referred to as "chip material") is produced by cutting a Cu strip and each groove of the heat-resistant plate receives one chip material.

(ii) The heat-resistant plate whose grooves receive the chip materials is heated up to 1,100-1,300° C. in the oven filled with ammonia decomposition gas and its heating treatment is performed for 30-60 minutes. When the temperature in the oven becomes equal to or higher than the melting point of Cu, the chip material is melted and becomes a spherical shape. After that, the oven is cooled and then the Cu ball is formed in the groove of the heat-resistive plate.

(iii) After cooling, the formed Cu ball is again under the heating treatment whose temperature is 800-1,000° C. lower than the melting point of Cu. A purpose of the reheating treatment is to reduce the alpha dose by volatizing the remained radioactive elements.

One of the other methods of forming the sphere is an atomizing method wherein the molten Cu is dropped through an orifice provided at a bottom of a crucible and the formed droplet is cooled to form the sphere as the Cu ball. Another method is to heat the Cu cut-metal to a temperature equal to or higher than 1,000° C. by thermal plasma for forming the sphere.

The formed sphere of the Cu ball may be under the reheating treatment at a temperature of 800-1,000° C. for 30-60 minutes. The Cu material for the Cu ball may be under the heating treatment at a temperature of 800-1,000° C. before forming the sphere of the Cu ball.

A palette, a wire, a pillar, etc. can be used for the Cu material that is the raw material of the Cu ball. The pure degree of the Cu material may be 99.90-99.99% to prevent the pure degree of the Cu ball from decreasing too much. In a case of the Cu material having the high pure degree, the holding temperature of the molten Cu may be reduced to about 1,000° C. as being conventionally done without the aforementioned heating treatment.

The above-described heating treatment may be deleted or modified appropriately by reference to the pure degree and the alpha dose of the Cu material. Moreover, in a case of manufacturing the Cu ball having the high alpha dose or the Cu ball having a different shape, the Cu ball can be reused as the raw material and the alpha dose can be reduced.

(3b) Solder Plating Film Treatment

The plating film is formed by dipping the Cu ball formed as described above in the plating solution and flowing the plating solution. An example will be described for forming the Cu core ball having a diameter of about 300 μm by forming the Sn—Bi solder plating film having a thickness of 50 μm on the Cu ball having a diameter of 250 μm.

(3b1) The plating solution used for the present invention is a mixture of a water based medium, alkyl sulfonic acid compound or alkanol sulfonic acid compound, and metallic compound including Sn, Bi as essential components. It will be described hereinafter in detail.

(3b2) In the embodiment of using the above-described plating solution, the plating treatment is executed under a condition of adjusting an electrical quantity to 0.178 coulomb so that the Cu ball having the diameter of 250 μm is coated with the film having the thickness of 50 μm. This plating treatment is performed by flowing the plating solution. A flowing method is not specified as will be described hereinafter.

(3b3) The Cu core ball can be obtained by drying it in atmospheric air or N$_2$ atmosphere for a predetermined period after the plating treatment. This solder plating film treatment can be applied to a format of column, pillar or pellet of Cu as the core.

In order to measure the sphericity and the alpha dose of the Cu core ball, the following Cu core ball (sample) was prepared.

4. Example of Preparing Sample Cu Ball (4a) Cu Ball

Figure 4:
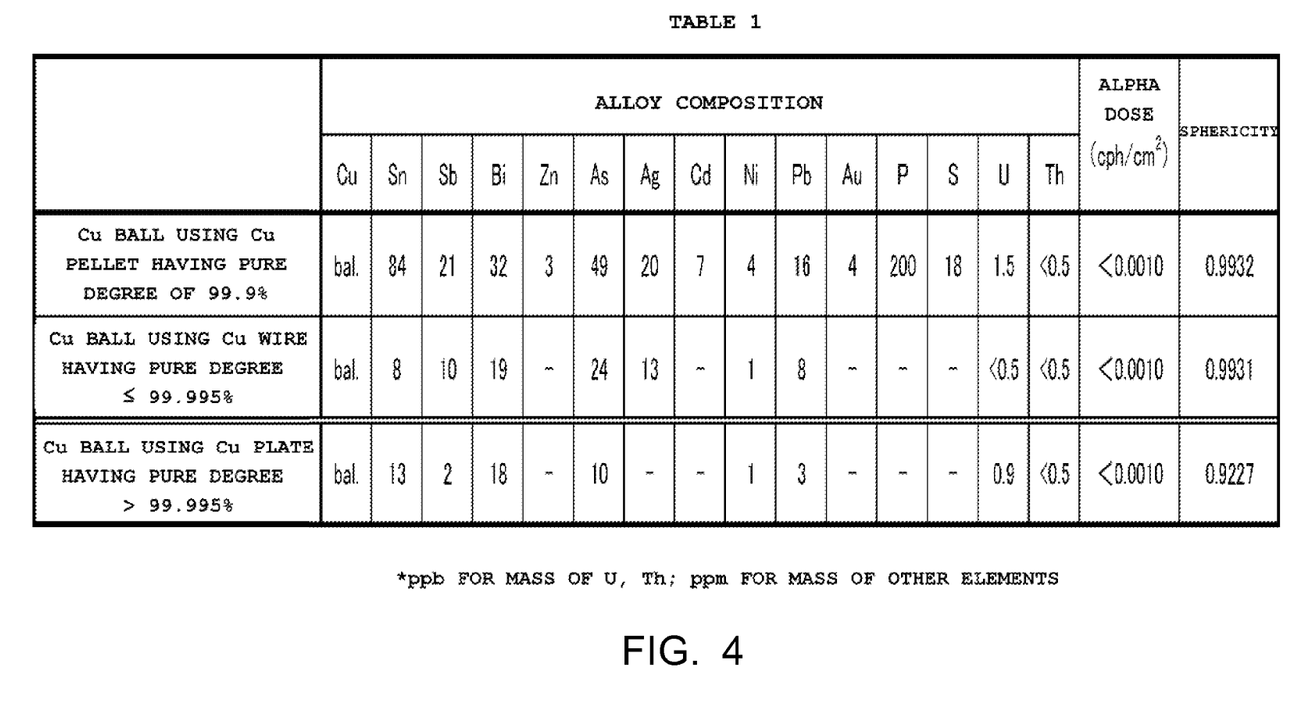
FIG. 4 shows Table 1 that represents an element analysis result and a sphericity of a formed Cu ball.

The condition for manufacturing the Cu ball having the high sphericity was researched. The Cu pellet having the pure degree of 99.9%, the Cu wire having the pure degree equal to or less than 99.995% and the Cu plate having the pure degree larger than 99.995% were prepared. After each of them was put in each of the crucibles, their temperature was elevated to 1,200° C. and the heating treatment was performed for 45 minutes. The molten Cu was dropped through the orifice provided at the bottom of the crucible. The formed droplet was cooled to form the sphere of the Cu ball. The formed Cu ball has an average grain diameter of 250 μm. Table 1 shown in FIG. 4 represents the element analysis result and the sphericity of the formed Cu ball.

(4b) Sphericity of Cu Ball

The sphericity should be equal to or higher than 0.95. The sphericity was measured by using a CNC image measurement system.

This system was an ultra-quick vision model ULTRA QV 350-PRO manufactured by Mitsutoyo Corporation. The sphericity is an arithmetic mean value calculated by dividing a diameter (a length of a shortest axis) of each of 500 Cu balls by a length of the longest axis of each Cu ball. The closer to the upper limit 1.00, the closer to the true sphere.

Figure 1:
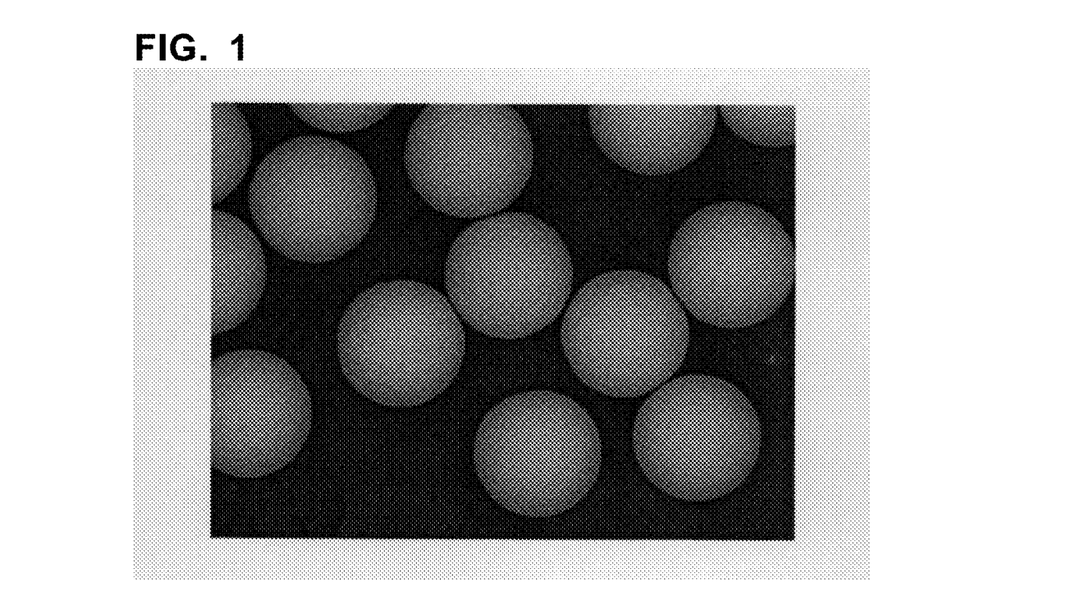
FIG. 1 shows a SEM photograph of a Cu ball manufactured by using a Cu pellet having a pure degree of 99.9%.
Figure 2:
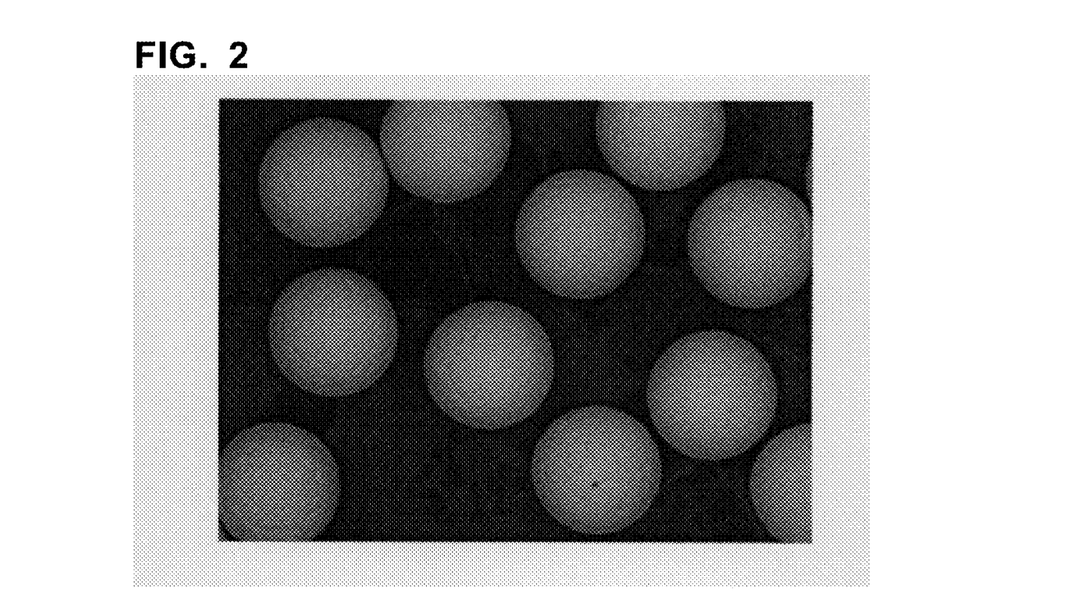
FIG. 2 shows a SEM photograph of a Cu ball manufactured by using a Cu wire having a pure degree equal to or less than 99.995%.
Figure 3:
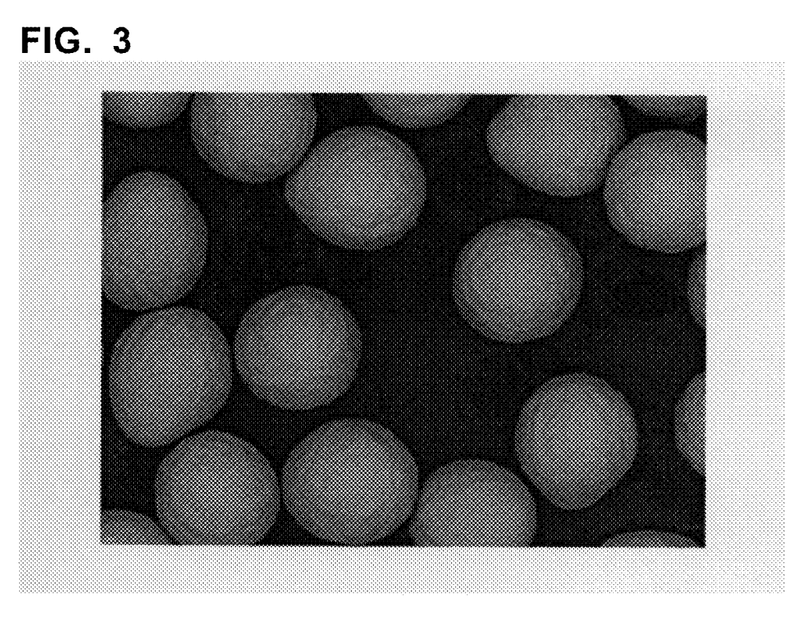
FIG. 3 shows a SEM photograph of a Cu ball manufactured by using a Cu plate having a pure degree larger than 99.995%.

In the measurement of the sphericity, the length of the diameter and the length of the longest axis of the Cu ball are values measured by the ultra-quick vision model ULTRA QV 350-PRO manufactured by Mitsutoyo Corporation. FIGS. 1-3 show SEM photographs of each formed Cu ball. FIG. 1 is the SEM photograph of the Cu ball manufactured by using a Cu pellet having a pure degree of 99.9%. FIG. 2 is the SEM photograph of the Cu ball manufactured by using a Cu wire having a pure degree equal to or less than 99.995%. FIG. 3 is the SEM photograph of the Cu ball manufactured by using a Cu plate having a pure degree higher than 99.995%. A magnification ratio of these SEM photographs is 100 times.

(4c) Alpha Dose of Cu Ball

An alpha-ray measurement instrument of a gas-flow proportional counter type was used to measure the alpha dose. A measurement sample is the Cu balls that are bedded on a bottom of a low-depth vessel having a flat bottom of 300 mm×300 mm so as not to see the bottom. This measurement sample was put in the alpha-ray measurement instrument and is remained in an atmosphere of PR-10 gas flow for 24 hours. Then, the alpha dose was measured.

The PR-10 gas (argon 90% and methane 10%) used for the measurement was that the PR-10 gas filled in a gas bottle and was kept for a period equal to or longer than three weeks.

A reason why using the gas bottle kept for the period equal to or longer than three weeks is based on JESD221 of JEDEC STANDARD-Alpha Radiation Measurement in Electronic Materials determined by JEDEC (Jint Electron Device Engineering Council) so as not to produce the alpha-ray by radon in the atmospheric air that enters into the gas bottle.

(4d) Analyzing Element of Cu Ball

The element analysis was executed with an inductively-coupled plasma mass spectrometry (ICP-MS analysis) for U and Th and an inductively-coupled plasma emission spectrometry (ICP-AES analysis) for the other elements.

A table 1 in FIG. 4 shows the element analysis result and alpha dose of the manufactured Cu ball.

As shown in FIGS. 1, 2 and 4 (Table 1), the sphericity is equal to or higher than 0.990 for the Cu balls using the Cu pellet having the pure degree of 99.9% and the Cu wire having the pure degree equal to or less than 99.995%. On the other hand, as shown in FIGS. 3 and 4 (Table 1), the sphericity is less than 0.95 for the Ca ball using the Cu plate having the pure degree higher than 99.995%.

Therefore, the sample (embodiments 1 and 2) is the Cu core ball formed by using the Cu ball manufactured with the Cu pellet having the pure degree of 99.9%.

5. Solder Plating Film for Sample

The Sn—Bi based alloy is used for the solder plating film. By using the Sn—Bi based alloy, it is possible to reduce the junction temperature at the soldering junction to a value equal to or less than 200° C. and preferably to about 160° C.

By using Bi, the melting temperature of the solder alloy can be adjusted similarly to Sn. By adding a predetermined amount of Bi to Sn, the melting point is decreased with an eutectic reaction. In order to suppress a liquidus-line temperature (junction melting temperature) to a value equal to or less than 200° C. and preferably about 160° C., the contained amount of Bi is equal to or higher than 40%. Since the joint strength of the solder lowers in accordance with the contained amount of Bi, the contained amount of Bi is set to a value equal to or less than 60%.

In addition, by devising of the plating treatment, it is possible to reduce significantly the incorporation of the radioactive isotope contained in the plating solution into the solder plating film. Thus, the alpha dose of solder plating film can be lowered. A manufacturing example will be described to manufacture the Cu core ball having the high sphericity by using the Cu pellet.

(5a) Preparation of Solder Plating Film

The Sn—Bi solder plating film is formed by using the Cu ball made of the Cu pellet having the pure degree of 99.9% under the following conditions. The plating solution used for the embodiment is a mixture of a water based medium, alkyl sulfonic acid compound or alkanol sulfonic acid compound, and metallic compound including Sn, Bi as essential components. Since the metallic compound exists as Sn ion and Bi ion in the plating solution, it is preferable to contain an organic complexing agent to secure the stability of these metallic ions.

The plating treatment is executed with an electrolysis. According to Faraday's law of electrolysis, the deposition amount of the desired solder plating and the electrical quantity Q (coulomb C) are calculated. Then, under a condition that a current I (A) is applied for a predetermined time t (second) to reach the calculated electrical quantity Q, the plating treatment is performed by flowing the Cu ball and the plating solution. The electrical quantity Q is represented by [I×t].

When forming the solder plating film comprising Sn—Bi (for example, Sn-58Bi) film having a thickness of 50 μm coated on the Cu ball having a diameter of 250 μm, the electrical quantity Q is 0.178 coulomb.

There are some methods for forming the solder plating film on the Cu ball by flowing the plating solution. One of them is an electrolytic plating method for a well-known barrel plating, etc. Another method is that a pump is provided in a plating bath to stir the plating solution and form the solder plating film on the Cu ball with the high-speed turbulent flow of the plating solution. Additional method is that a vibration plate is provided in the plating bath, and the vibration plate is vibrated at a predetermined frequency to generate the high-speed turbulent flow of the plating solution for forming the plating film. In a comparison example 1 in Table 2 that will be described hereinafter, the Cu core ball is made by forming the Sn solder film with a welding method under the following condition. In particular, a lot of mortar shaped grooves are provided at a predetermined portion of an aluminum plate where the soldering is difficult.

By using the aforementioned Sn sheet material, the Sn ball having a diameter of 300 μm is previously prepared by the well-known atomizing method. Each of the Cu ball and the Sn ball is put in each groove provided at the aluminum substrate and the flux is jetted.

Then, the aluminum substrate is heated in a heating oven to 270° C. to melt the Sn ball. The melt Sn saturates around the Cu ball and coats the Cu ball with the surface tension. As described hereinbefore, the Cu core ball of the comparison example 1 is prepared. The thickness of the solder film is 50 μm.

(5b) Composition of Solder Plating Film

The alloy composing the solder plating film is the Sn—Bi based alloy. In particular, as described hereinbefore, it is the Sn—Bi alloy or an alloy wherein at least one of elements Ag, Cu, Ni, In, Zn, Sb, Ge, Co, P and Fe is added to the Sn—Bi based alloy. They may be Sn—Bi—In alloy, Sn—Bi—Ag—

In alloy, Sn—Bi—Ag—Cu alloy, Sn—Bi—Ni alloy, Sn—Bi—Cu—Ni alloy, etc. The contained amount of Bi in each alloy is from 40 mass percent (including 40) to 60 mass percent (including 60).

(5c) As for Plating Solution

The plating solution may be methanesulfonic acid Sn, methanesulfonic acid Bi, methanesulfonic acid, surface acting agent or the like. In particular, methanesulfonic acid stannous was used for the methanesulfonic acid Sn, tris(methanesulfonic acid) Bi was used for the methanesulfonic acid Bi, α-naphthol polyethoxylate was used for the methanesulfonic acid, and acetylcysteine as one of mercaptan compounds was used for the surface acting agent.

The Sn sheet material was prepared as the raw material for the methanesulfonic acid stannous. The Bi sheet material was prepared as the raw material for the tris(methanesulfonic acid) Bi.

In the element analysis of the Sn sheet and the Bi sheet as the raw material of the solder plating solution and the element analysis of the solder plating film formed on the surface of the Cu core ball, the high-frequency inductively-coupled plasma mass spectrometry (ICP-MS analysis) was used for U and Th of the radioactive elements, and the high-frequency inductively-coupled plasma emission spectrometry (ICP-AES analysis) was used for the other elements.

The refined Bi material is used for Bi. For example, the material refined with about 4N level is used. In this refining process, parts of the radioactive elements and isotopes contained in the metallic compound can be removed.

However, this refining process cannot reduce the alpha dose of Bi to a value equal to or less than 0.0200 cph/cm$^2$. One of reasons why the alpha dose cannot be reduced may be a disintegration of the radioactive isotope. A half-life is a period while a half of a radioactive isotope changes to another nuclide with a radioactive decay. For example, the radioactive isotope of Bi has a short half-life and it disintegrates to another radioactive isotope such as Po and the like with time after the refining process in the plating treatment. By this disintegration, there is Po or the like emitting a radioactivity in the plating solution.

It was found that the radioactive elements and the radioactive isotopes can be removed by flowing the plating solution to deposit the disintegrated Po and Pb as salt in the plating treatment. The salt is separated from the plating solution for the solder plating film and remains in the plating solution.

There are radioactive isotopes of Bi having a long half-life and a short half-life. The radioactive isotope having the long half-life is, for example, $^{209}$Bi and this half-life is very long, 1.9×10$^{19}$ years. If the disintegrated radioactive isotope having the short half-life is deposited in the plating process, Bi does not further disintegrate practically and the alpha dose does not increase.

Figure 5:
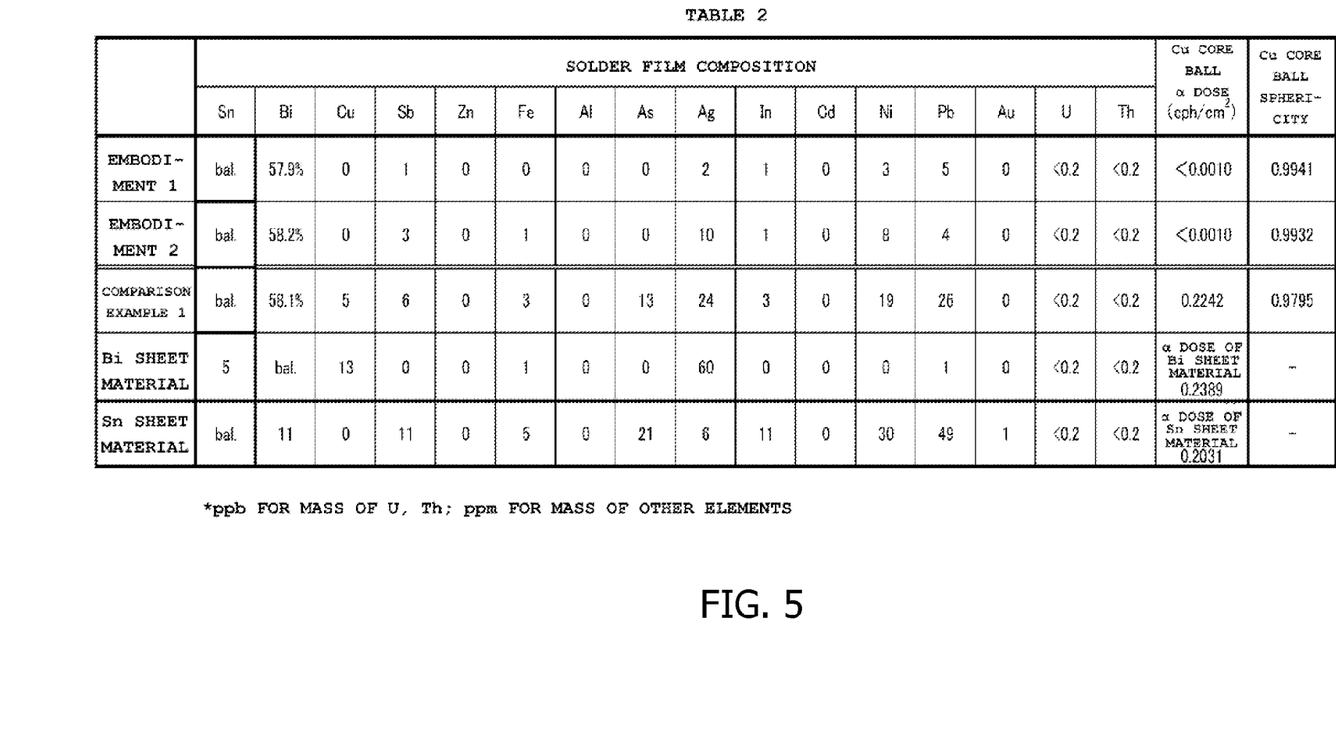
FIG. 5 shows Table 2 that represents measurement result of alpha dose and sphericity of some samples for a Cu core ball.

The alpha dose of the Sn sheet material and the Bi sheet material was measured similarly to the measurement for the Cu ball except that each sheet materials were bedded on a bottom of a low-depth vessel having a flat bottom of 300 mm×300 mm. The alpha dose of the Cu core ball was measured similarly to the measurement for the Cu ball. The sphericity of the Cu core ball was measured under the same conditions as the Cu ball. Table 2 shown in FIG. 5 represents the measurement results.

In Table 2, the solder plating film comprises Sn—Bi wherein the embodiment 1 shows that the contained amount of Bi is 57.9% and the embodiment 2 shows it is 58.2%. Impurities contained in the Sn—Bi solder plating film are components shown in Table 2. In the used plating solution, U and Th of the radioactive elements are equal to or less than 0.2 ppb.

The comparison example 1 is that the contained amount of Bi in Sn—Bi is 58.1%. A unit of the contained amount is ppm except Sn and Si. The Sn sheet and the Bi sheet were used for the base materials of the Sn—Bi metallic compound as shown in Table 2. Their alpha doses are shown in Table 2 wherein the alpha dose of the Sn sheet is 0.2031 cph/cm$^2$ and the alpha dose of the Bi sheet is 0.2389 cph/cm$^2$.

As understood from Table 2, the alpha dose of the Cu core ball in the comparison example 1 is kept to 0.2242 cph/cm$^2$; however, if the additive amount of Bi is slightly increased, the alpha dose of the Cu core ball is significantly improved as shown in the embodiments 1 and 2. A reason of the lowered alpha dose may be that the disintegrated radioactive element and isotope deposit as the salt as described hereinbefore.

As a result of the refining process and the plating process of the metallic compounds, almost all of the radioactive element or isotope in the solder plating solution of Sn—Bi are removed. Therefore, the alpha dose of the solder plating film can be reduced significantly in addition to the lowered alpha dose of the Cu ball. Therefore, the alpha dose of the formed Cu core ball can be lowered significantly.

6. Flux Coated Core Ball

According to the core ball of the present invention, the surface of the solder plating film may be coated with the flux layer to form the flux coated core ball. The flux layer comprises one or plural kinds of composition for acting as an activator for preventing the metallic surface being oxidized and eliminating the metal-oxide film.

The components of the flux layer adheres to the surface of the core ball in its solid condition. Therefore, the flux layer may comprises the activator composition that adheres to the surface of the core ball in the solid condition, prevents the surface of the core ball being oxidized and removes the metallic oxide layer from the jointing target during the soldering operation. For example, the flux layer may comprises only one compound component that acts as the activator and adheres to the core ball.

One of amine, organic acid and halogen; a combination of plural kinds of amine; a combination of plural kinds of organic acid; a combination of plural kinds of halogen; or a combination of a single or plural kinds of amine, organic acid and halogen is added as the activator composing the flux layer in accordance with the characteristic required for the present invention.

The flux layer may comprise plural components including a compound of acting as the activator, another compound of acting as an active adjuvant and the like. The compound composing the flux layer, for example, the compound acting as the activator may be a compound that does not solidify by itself if it solidifies by mixing with another composite.

One of ester, amid and amino acid; a combination of plural kinds of ester; a combination of plural kinds of amid; a combination of plural kinds of amino acid; or a combination of a single or plural kinds of ester, amid and amino acid is added as the active adjuvant composing the flux layer in accordance with the characteristic of the activator.

The flux layer may include rhodine and resin in order to protect the compound and the like of acting as the activator from the heat during the reflow process. In addition, the flux layer may include resin for adhering the compound and the like of acting as the activator to the core ball.

In general, a color of the flux is different from that of the metal and a color of the metallic powder is different from that of the flux layer. Therefore, the adsorbed amount of the flux can be confirmed from the color degree, for example, luminance, yellow chromaticity and red chromaticity. A pigment may be mixed with the compound of composing the flux layer for coloring.

The flux layer may comprise a single layer consisting of a single or plural compounds. In addition, the flux layer may comprise plural layers consisting of plural compounds. The component of the flux layer adheres to the surface of the core ball in the solid condition. However, it should be a liquid or gas condition in the process of adhering the flux to the core ball.

In a case of the solution coating, the component of the flux layer should be soluble in the solution. However, if the salt is formed, some component is not soluble in the solution. When there is the component that is not soluble within the flux in the liquid form, an even absorption is difficult in the flux including a low solubility component that forms the deposition. Therefore, in the prior art, the flux in the liquid form could not be accomplished by mixing the compound of forming the salt.

On the other hand, according to the flux coated core ball (the core ball coated with the flux layer) according to the present invention, the flux layers are formed every layer in the solid condition to form the multi-layer type flux layer. Therefore, even if the compound of forming the salt is used and the compound is impossible to mix with the liquid form type flux, the flux layer can be formed. When the Cu core ball shown in Table 2 is coated with the flux, the alpha doses of all the embodiments were measured. As a result, the alpha doses were equal to or less than 0.0010 cph/cm$^2$ and they are lower than the required value 0.0200 cph/cm$^2$.

It is preferable that the metallic elements in the solder plating film are distributed uniformly in order to make the melting speed and the alpha dose uniform when forming the solder joint.

According to the present invention, the junction temperature can be lowered by using the Sn—Bi based alloy for the solder plating film. In addition, since the alpha dose of the solder plating film can be lowered, the total of the alpha dose of the core ball and the alpha dose of the Cu ball can be reduced significantly.

Although various embodiments, which incorporate the techniques of the present invention, have been shown and described in detailed herein, those skilled in the art will readily understand that many other varied embodiments may be incorporated using these techniques, and all are intended to lie within the scope of the following claims.

What is claimed is:

1. A core ball, comprising:
   a sphere-shaped metallic powder forming a core; and
   a solder plating film coating the surface of said metallic powder;
   wherein said metallic powder is a sphere in which a metallic degree of purity is equal to or higher than 99.9% but equal to or less than 99.995%, a total contained amount of Pb and/or Bi is equal to or larger than 1 ppm and its sphericity is equal to or higher than 0.95;
   said solder plating film is a Sn—Bi based Pb-free solder alloy including Bi in an amount of 40-60 mass percent and in which a contained amount of U and Th is equal to or less than 5 ppb respectively; and
   the alpha dose of said core ball is equal to or less than 0.0200 cph/cm$^2$.

2. The core ball according to claim 1 characterized in that the alpha dose of said solder plating film is equal to or less than 0.0020 cph/cm$^2$.

3. The core ball according to claim 1 characterized in that the alpha dose of said solder plating film is equal to or less than 0.0010 cph/cm$^2$.

4. The core ball according to claim 1 characterized in that said metallic powder is a Cu ball.

5. The core ball according to claim 1 characterized in that said metallic powder includes a plating layer comprising at least one element selected from the group comprising Ni and Co inside said solder plating film.

6. The core ball according to claim 1 characterized in that said Sn—Bi based alloy comprises a Sn—Bi alloy or a Sn—Bi alloy containing at least one element selected from the group comprising Ag, Cu, Ni, In, Zn, Sb, Ge, Co, P and Fe.

7. A flux coated core ball comprising a flux layer coating the core ball of claim 1.

8. A solder paste including the core ball of claim 1.

9. A formed solder including the core ball of claim 1.

10. A solder joint formed by using the core ball of claim 1.

11. A core ball, comprising:
    a sphere-shaped metallic powder forming a core; and
    a solder plating film coating the surface of said metallic powder;
    wherein said metallic powder is a sphere in which a metallic degree of purity is equal to or higher than 99.9% but equal to or less than 99.995%, a contained amount of U is equal to or less than 5 ppb, a contained amount of Th is equal to or less than 5 ppb, a total contained amount of Pb and/or Bi is equal to or larger than 1 ppm, its alpha dose is equal to or less than 0.0200 cph/cm$^2$, and its sphericity is equal to or higher than 0.95; and
    said solder plating film is a Sn—Bi based Pb-free solder alloy including Bi in an amount of 40-60 mass percent.

12. The core ball according to claim 11 characterized in that said solder plating film contains U and Th in amounts that are equal to or less than 5 ppb respectively and its alpha dose is equal to or less than 0.0200 cph/cm$^2$.

13. The core ball according to claim 12 characterized in that the alpha dose of said solder plating film is equal to or less than 0.0020 cph/cm$^2$.

14. The core ball according to claim 12 characterized in that the alpha dose of said solder plating film is equal to or less than 0.0010 cph/cm$^2$.

15. The core ball according to claim 11 characterized in that said metallic powder is a Cu ball.

16. The core ball according to claim 11 characterized in that said metallic powder includes a plating layer comprising at least one element selected from the group comprising Ni and Co inside said solder plating film.

17. The core ball according to claim 11 characterized in that said Sn—Bi based alloy comprises a Sn—Bi alloy or a Sn—Bi alloy containing at least one element selected from the group comprising Ag, Cu, Ni, In, Zn, Sb, Ge, Co, P and Fe.

18. A flux coated core ball comprising a flux layer coating the core ball of claim 11.

19. A solder paste including the core ball of claim 11.

20. A formed solder including the core ball of claim 11.

21. A solder joint formed by using the core ball of claim 11.

* * * * *